United States Patent
Chen et al.

(10) Patent No.: US 9,941,611 B2
(45) Date of Patent: Apr. 10, 2018

(54) CONNECTION STRUCTURES FOR PROVIDING A REFERENCE POTENTIAL TO A FLEXIBLE CIRCUIT DEVICE

(71) Applicant: Intel Corporation, Santa Clara, CA (US)

(72) Inventors: Kuan-yu Chen, Hillsboro, OR (US); Hao-han Hsu, Portland, OR (US); Jingbo Li, Portland, OR (US); Xiang Li, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 13 days.

(21) Appl. No.: 14/866,610

(22) Filed: Sep. 25, 2015

(65) Prior Publication Data
US 2017/0093059 A1    Mar. 30, 2017

(51) Int. Cl.
*H01R 12/59* (2011.01)
*H05K 1/02* (2006.01)
(Continued)

(52) U.S. Cl.
CPC ......... *H01R 12/594* (2013.01); *H01R 43/205* (2013.01); *H05K 1/0216* (2013.01);
(Continued)

(58) Field of Classification Search
CPC ........... H05K 1/148; H05K 2201/0715; H05K 2201/10189; H01R 12/594
See application file for complete search history.

(56) References Cited

U.S. PATENT DOCUMENTS 6,055,722 A * 5/2000 Tighe ............... H01R 12/62
29/839
8,969,737 B2 * 3/2015 Just .................. H05K 1/0218
174/350
(Continued)

FOREIGN PATENT DOCUMENTS

| JP | 2010232266 | 10/2010 |
|---|---|---|
| KR | 1020050094601 | 9/2005 |
| KR | 101327054 | 11/2013 |

OTHER PUBLICATIONS

International Search Report and Written Opinion for PCT Patent Application No. PCT/US16/42661 dated Oct. 21, 2016, 16 pgs.
(Continued)

*Primary Examiner* — Hung V Ngo
(74) *Attorney, Agent, or Firm* — Womble Bond Dickinson (US) LLP

(57) ABSTRACT

Techniques and mechanisms for providing a reference potential with a flexible circuit device. In an embodiment, the flexible circuit device includes a first interconnect to exchange a signal and a second interconnect to exchange a reference potential that facilitates shielding of the signal. The first and second interconnects are variously coupled to a printed circuit board (PCB) via a first contact and a second contact of a hardware interface. During such coupling, a maximum height of the second interconnect from a side of the PCB at the hardware interface is greater than a maximum height of the first interconnect from the side of the PCB at the hardware interface. In another embodiment, a distance of the first contact from an end of the flexible circuit device is different than a distance of the second contact from the end of the flexible circuit device.

5 Claims, 9 Drawing Sheets

(51) Int. Cl.
*H01R 43/20* (2006.01)
*H05K 1/14* (2006.01)

(52) U.S. Cl.
CPC ............. *H05K 1/0219* (2013.01); *H05K 1/14* (2013.01); *H05K 1/147* (2013.01); *H05K 1/0215* (2013.01); *H05K 2201/10189* (2013.01)

(56) References Cited

U.S. PATENT DOCUMENTS

2011/0230146 A1   9/2011   Morishita et al.
2015/0022227 A1   1/2015   Wang et al.

OTHER PUBLICATIONS

Hall, et al., "Flexible Circuit Structures for High-Bandwidth Commuincation", U.S. Appl. No. 14/752,639, filed Jun. 26, 2015.

\* cited by examiner

US 9,941,611 B2

CONNECTION STRUCTURES FOR PROVIDING A REFERENCE POTENTIAL TO A FLEXIBLE CIRCUIT DEVICE

BACKGROUND

1. Technical Field

Embodiments of the invention relate generally to flexible circuit devices and more particularly, but not exclusively, to structures for providing a ground potential with a flexible printed circuit.

2. Background Art

In various laptop, Ultrabook, smartphone and other designs, it is common to provide electrical signaling between a printed circuit board (PCB), or other rigid circuit device, and flexible circuitry such as that of a flexible printed circuit (FPC) or a flexible flat cable (FFC). Direct soldering of FPC or FFC signal traces to a PCB is a common usage in these platforms.

FIG. 1A shows a cross-sectional view of a conventional system 100 wherein a FPC 106 includes a signal line 110 coupled to exchange a signal between PCBs 112, 114. Signal line 110 is directly coupled at ends 120, 122 of FPC 106 to respective interface hardware (not shown) of PCBs 112, 114. A floating ground plane 108 of FPC 106 provides shielding for the signal exchanged via signal line 110. In system 100, signal line 110 is closer than floating ground plane 108 to PCBs 112, 114, where a maximum height of floating ground plane 108 above PCBs 112, 114 is greater than a corresponding height of signal line 110. Floating ground plane 108 is not tied to a reference potential on PCB 112 or PCB 114, and is allowed to "float" electrically, which, while accommodating flexibility, is susceptible to radio frequency interference (RFI) issues.

FIG. 1B shows a cross-sectional view of another conventional system 102 wherein a FPC 136 includes a signal line 140 and a ground line 142 coupled to exchange, respectively, a signal and a reference potential between PCBs 132, 134. Signal line 140 and ground line 142 are each directly coupled at ends 150, 152 of FPC 136 to respective interface hardware (not shown) of PCBs 132, 134, where a maximum height of signal line 140 above PCBs 112, 114 is greater than or equal to a corresponding maximum height of ground line 142. A floating ground plane 138 of FPC 136 provides shielding for the signal exchanged via signal line 140, where a maximum height of floating ground plane 138 above PCBs 132, 134 is greater than a corresponding maximum height of signal line 140. Floating ground plane 138 is not directly coupled to any grounding contact of either PCB 132 or PCB 134.

FIG. 1C shows a cross-sectional view of another conventional system 104 wherein a FPC 170 includes a signal line 174 coupled to exchange a signal with a PCB 160. Signal line 174 is directly coupled to a connector 162 of PCB 160. A floating ground plane 172 of FPC 170 cannot provide complete shielding for the signal exchanged via signal line 174, where signal line 174 is closer than floating ground plane 172 to PCB 160. A connector shield 164 of PCB 160 extends over and around an end of FPC 170 at the point of coupling to connector 162. Floating ground plane 172 is not directly coupled to any grounding contact of PCB 160 (or any other rigid circuit device).

Flexible shielding structures disposed over signal lines (such as those variously illustrated by floating ground planes 108, 138, 172) are reaching the limits of their effectiveness as signaling technologies continue to trend toward higher frequencies and lower signal power. For example, electromagnetic interference (EMI)—such as radio frequency interference (RFI) resulting from signal reflection 180 near connector shield 164 and other such structures—will have an increasingly significant effect on signal communication. As successive generations of electronic devices continues to provide greater integration, higher signal frequency, lower signal power, etc., there is expected to be an increasing value placed on incremental improvements in how signal shielding is provided with flexible circuitry.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and mechanisms for providing a reference potential with a flexible circuit device. As used herein, "flexible circuit device" refers to any of the variety of devices including a flexible substrate and circuit structures disposed therein. The flexible circuit device—e.g., a FPC or a FFC—may have a hardware interface comprising exterior contacts (e.g., including conductive pads, pins, bumps and/or other such connector hardware) configured to couple the flexible circuit device to a printed circuit board. The flexible circuit device may further comprise interconnects variously extending in the flexible substrate, where contacts of the hardware interface variously couple each to a respective one of such interconnects. For example, the hardware interface may comprise a first contact and a second contact at an exterior of the flexible circuit device, the first contact and second contact coupled, respectively, to a first interconnect and a second interconnect disposed in the flexible substrate. In an illustrative scenario according to one embodiment, the flexible substrate is coupled to a printed circuit board via the hardware interface, where the first contact exchanges a signal between the first interconnect and the printed circuit board, while the second contact exchanges a reference potential with the printed circuit board. In such an embodiment, a portion of the first interconnect may be closer than a portion of the second interconnect to the printed circuit board. For example, a maximum height of the second interconnect from a side of the printed circuit board at the hardware interface may be greater than a maximum height of the first interconnect from the side of the printed circuit board at the hardware interface.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including one or more packaged IC devices.

Figure 1A:
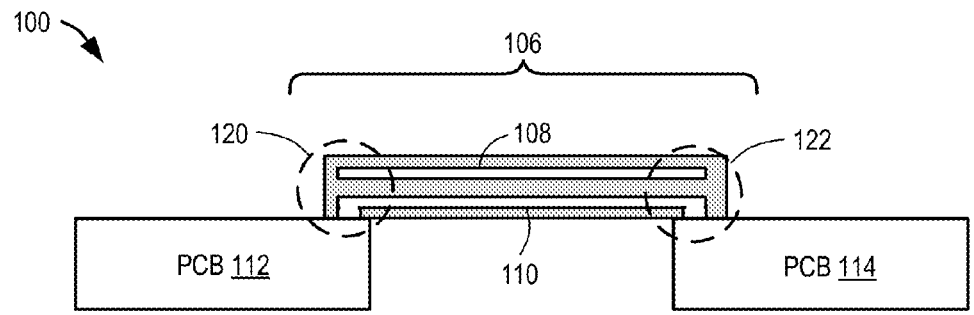
FIGS. 1A-1C show various conventional techniques for coupling a flexible circuit device.
Figure 1B:
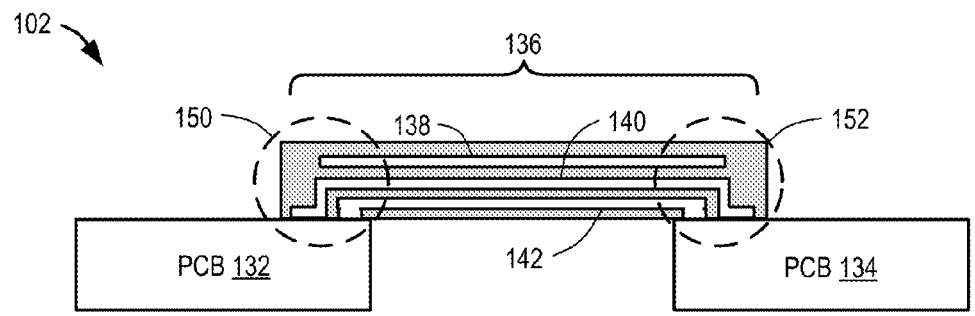
Figure 1C:
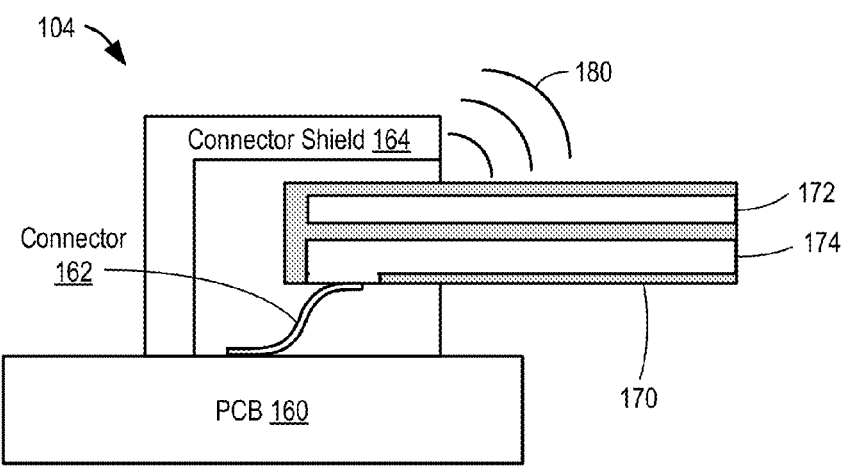
Figure 2:
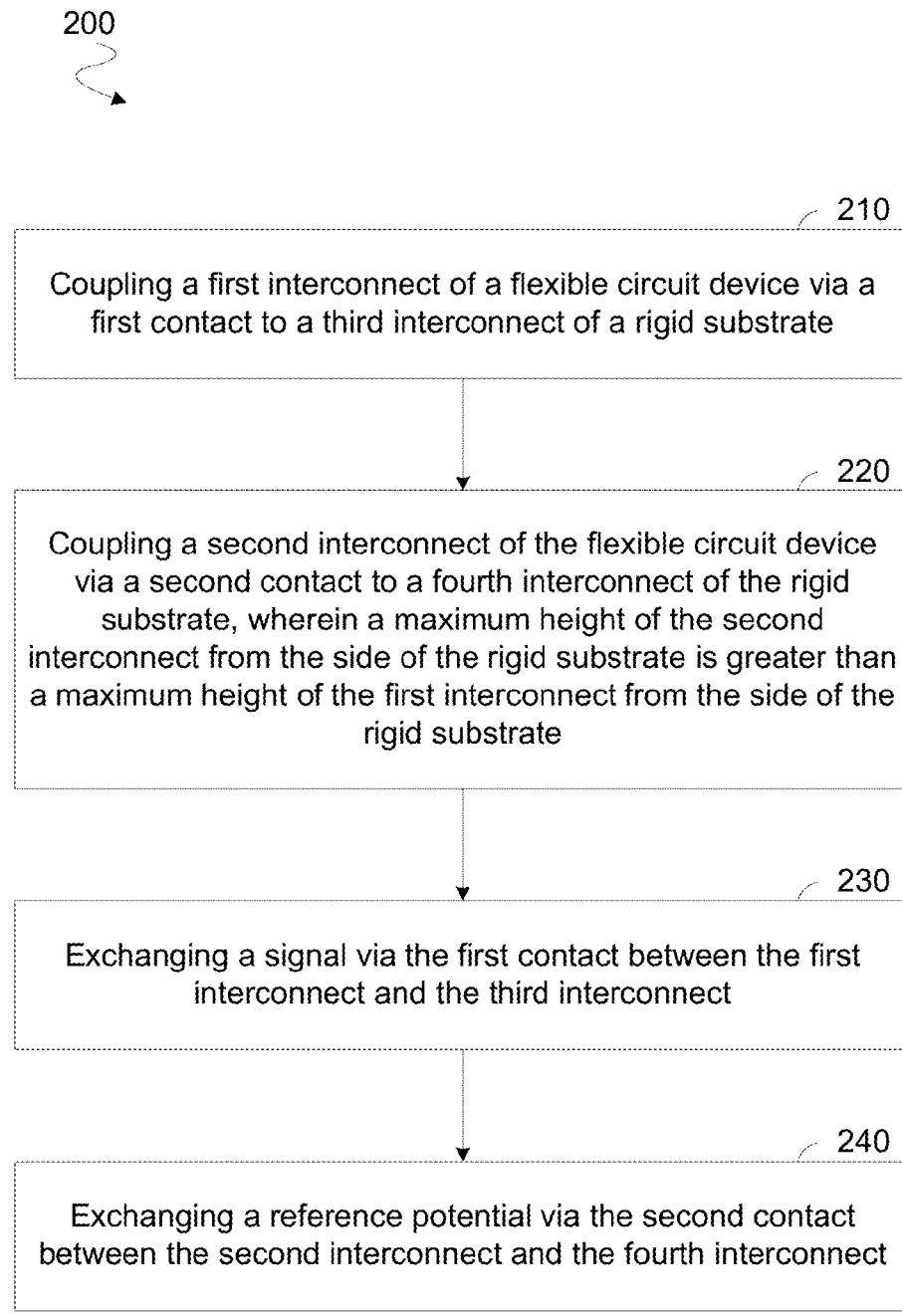
FIG. 2 is a flow diagram illustrating elements of a method for providing a reference potential to a flexible circuit device to an embodiment.

FIG. 2 illustrates elements of a method for providing a reference potential with a flexible circuit according to an embodiment. To illustrate certain features of various embodiments, operations of method 200 are described herein with reference to a system 300 shown in FIG. 3. However, such description may be extended to additionally or alternatively apply, according to different embodiments, to any of a variety of other flexible circuit devices and/or systems including a flexible circuit device. System 300 may include a processing-capable platform or operate as a component of such a platform.

Method 200 is one example of processing, according to an embodiment, that couples a flexible circuit device to a rigid substrate such as that of a PCB. The flexible circuit device may include a flexible substrate, having interconnects disposed therein, and a hardware interface including a first contact and a second contact that, for example, are each disposed at a side of the flexible substrate. In the illustrative embodiment of system 300, a flexible circuit device 320 is coupled to a PCB 310, where flexible circuit device 320 includes a flexible substrate 322 having disposed therein an interconnect 326 and an interconnect 324. Different embodiments may be variously provided, for example, by flexible circuit device 320 only, by PCB 310 only, or by all of system 300.

The material of flexible substrate 322 may include, for example, polyimide, polyethylene terephthalate and/or any of a variety of materials used in conventional flexible printed circuits or flexible cable manufacturing techniques, which are not limiting on some embodiments. Interconnects 324, 326 may each include any of a variety of combinations of conductive via structures and/or trace structures—e.g., where such structures include copper and/or other any of various other metals adapted from conventional flexible circuit technologies.

Coupling the flexible circuit device to the rigid substrate may include, at 210, coupling the first interconnect via the first contact to a third interconnect extending in the rigid substrate. Such coupling may further comprise, at 220, coupling the second interconnect via the second contact to a fourth interconnect extending in the rigid substrate. While the rigid substrate is coupled to the flexible circuit device, a maximum height of the second interconnect from the side of the rigid substrate at the hardware interface may be greater than a maximum height of the first interconnect from the side of the rigid substrate at the hardware interface. Referring again to the example embodiment of system 300, flexible circuit device 320 may further comprise a hardware interface configured to couple flexible circuit device 320 to PCB 310 (or other such rigid circuit device), the hardware interface including contacts 314, 316 coupled—respectively—to interconnects 326, 324. In some embodiments, flexible circuit device 320 and PCB 310 coupled together at least by soldering via a solder material that comprises, or is disposed on, one or both of contacts 314, 316. While flexible circuit device 320 is coupled to PCB 310, a height h2 of interconnect 324 from a side 312 of PCB 310 at the hardware interface may be greater than a height h1 of interconnect 326 from side 312 at the hardware interface. In conventional flexible circuit devices, shielding structures that are to extend over a signal line (e.g., at a greater maximum height from a PCB) are floated, and not directly coupled to a PCB or other such device.

In an embodiment, method 200 further comprises, at 230, exchanging a signal via the first contact between the first interconnect and the third interconnect. At 240, method may further include (e.g., concurrently with the exchanging at 230) exchanging a reference potential, via the second contact, between the second interconnect and the fourth interconnect. By way of illustration and not limitation, while flexible circuit device 320 is coupled to PCB 310, contact 314 may exchange signaling between interconnect 326 and an interconnect 332 of PCB 310—e.g., where such signaling includes one or more of a data signal, address signal, control signal, clock signal and/or the like. Alternatively on in addition, contact 316 may exchange a reference potential between interconnect 324 and an interconnect 330 of PCB 310. The reference potential may be provided to interconnect 324 to aid in shielding of a signal that is concurrently exchanged via interconnect 326. For example, interconnect 324 may form a sheet structure that overlaps a width of interconnect 326—e.g., where a width of interconnect 324 is at least two times (and in some embodiments, at least four times) a width of interconnect 326. In some embodiments, interconnect 324 is a structure that further extends across multiple other signal line interconnects (not shown) that, like interconnect 326, are to variously transmit signals through flexible substrate 322. Certain embodiments are not limited with respect to a particular type and/or number of signals that may be exchanged via interconnect 326.

Figure 3:
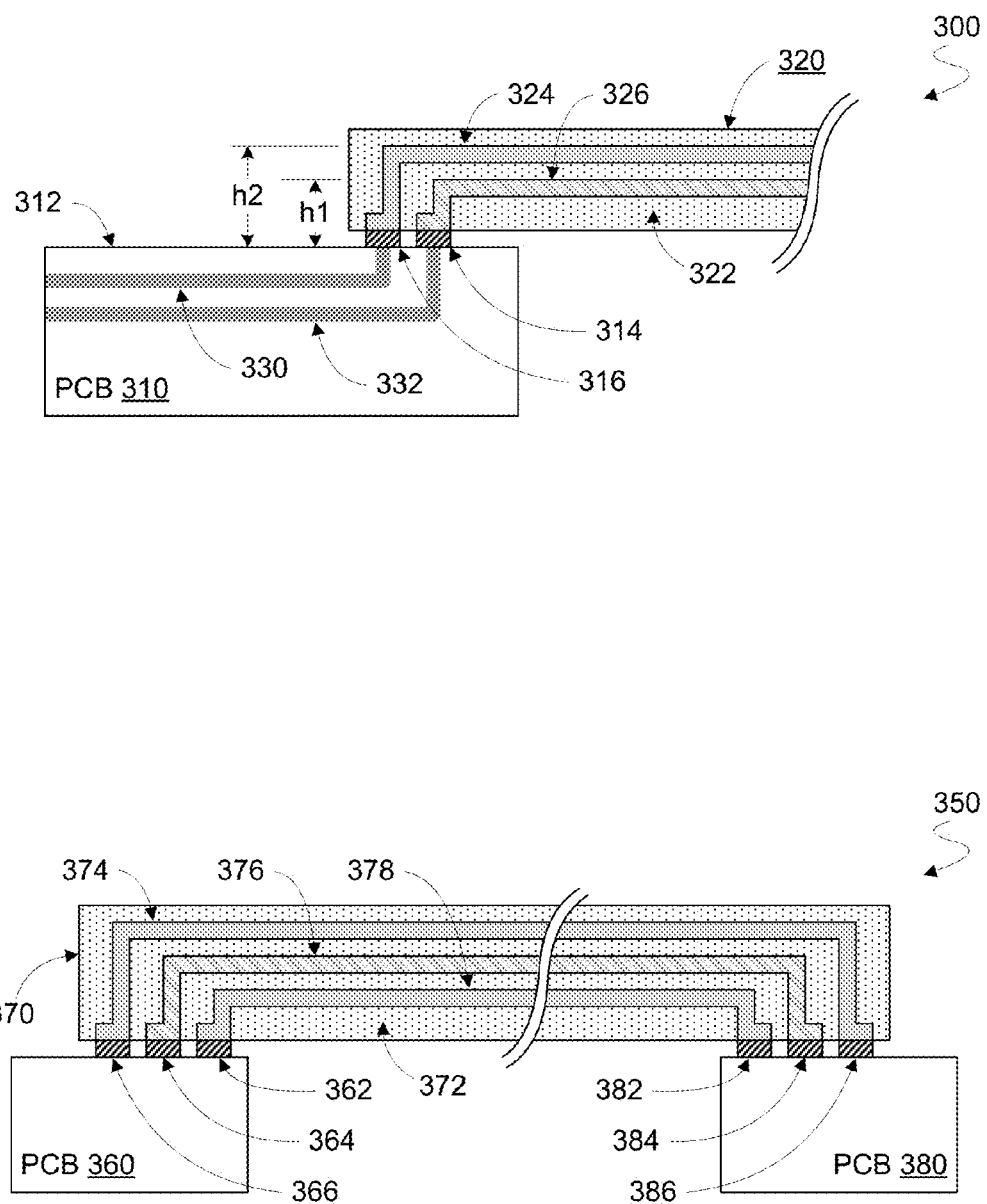
FIG. 3 is a cross-sectional diagram illustrating elements of a system to couple a flexible circuit to a reference potential according to an embodiment.

An additional cross-sectional view of FIG. 3 shows a system 350 to provide shielding with a flexible circuit according to another embodiment. System 350 may include one or more features of system 300 and/or may be fabricated according to method 200. In system 350, a flexible circuit device 370 is coupled between PCBs 360, 380, where flexible circuit device 370 includes a flexible substrate 372 having disposed therein interconnects 374, 376, 378.

Flexible circuit device 370 may further comprise hardware interfaces each at a respective end of flexible substrate 372, the hardware interfaces configured to couple flexible circuit device 370 each to a respective one of PCBs 360, 380. In an embodiment, one such hardware interface includes contacts 366, 364, 362 coupled—respectively—to interconnects 374, 376, 378. Another such interface may include contacts 386, 384, 382 coupled—respectively—to interconnects 374, 376, 378. In some embodiments, flexible circuit device 370 is soldered to one or both of PCBs 360, 380 via some or all such contacts.

While flexible circuit device 370 is coupled to PCBs 360, 380, contacts 364, 384 may be coupled to exchange a data signal, control signal and/or other signal between interconnect 376 and respective interconnects (not shown) of PCBs 360, 380. Alternatively on in addition, at least one of contacts 366, 386 may exchange a reference potential (e.g., a ground) with interconnect 374. In some embodiments, interconnect 374 is directly coupled to only one of PCBs 360, 380—e.g., where one of contacts 366, 386 is omitted from system 300. The reference potential may be provided to interconnect 374 for shielding of a signal that is concurrently exchanged via interconnect 376—e.g., where interconnect 374 is a ground plane structure that overlaps a width of interconnect 376 and, in some embodiments, one or more other interconnects (not shown) of flexible circuit device 370.

Although certain embodiments are not limited in this regard, interconnect 368 may be coupled via contacts 362, 382 to exchange a ground signal between respective interconnects (not shown) of PCBs 360, 380. Such a ground signal may be exchanged for a reason other than shielding of a signal exchanged via interconnect 376. For example, a size and/or location of interconnect 378 may be insufficient to provide adequate shielding for interconnect 376. In an embodiment, interconnect 378 provides a reference potential from one of PCBs 360, 380 to enable operation of circuitry at the other of PCBs 360, 380. In some embodiments, interconnect 378 is coupled to additionally or alternatively exchange a data, control and/or other signal (other than a ground signal).

While flexible circuit device 370 is coupled to PCB 360, a height of interconnect 374 from a side of PCB 360 (and/or a side of PCB 380) at a respective hardware interface may be greater than a height of interconnect 376 from that side at the same hardware interface. Alternatively or in addition, a height of interconnect 376 from that side at the same hardware interface may be greater than a height of interconnect 378 from that side at the hardware interface. Conventionally, flexible circuit devices to couple to a PCB variously float any shield structure that is disposed above a signal line (where "above" in this context refers to the characteristic of having a greater maximum height, as measured from a surface of a PCB).

Figure 4:
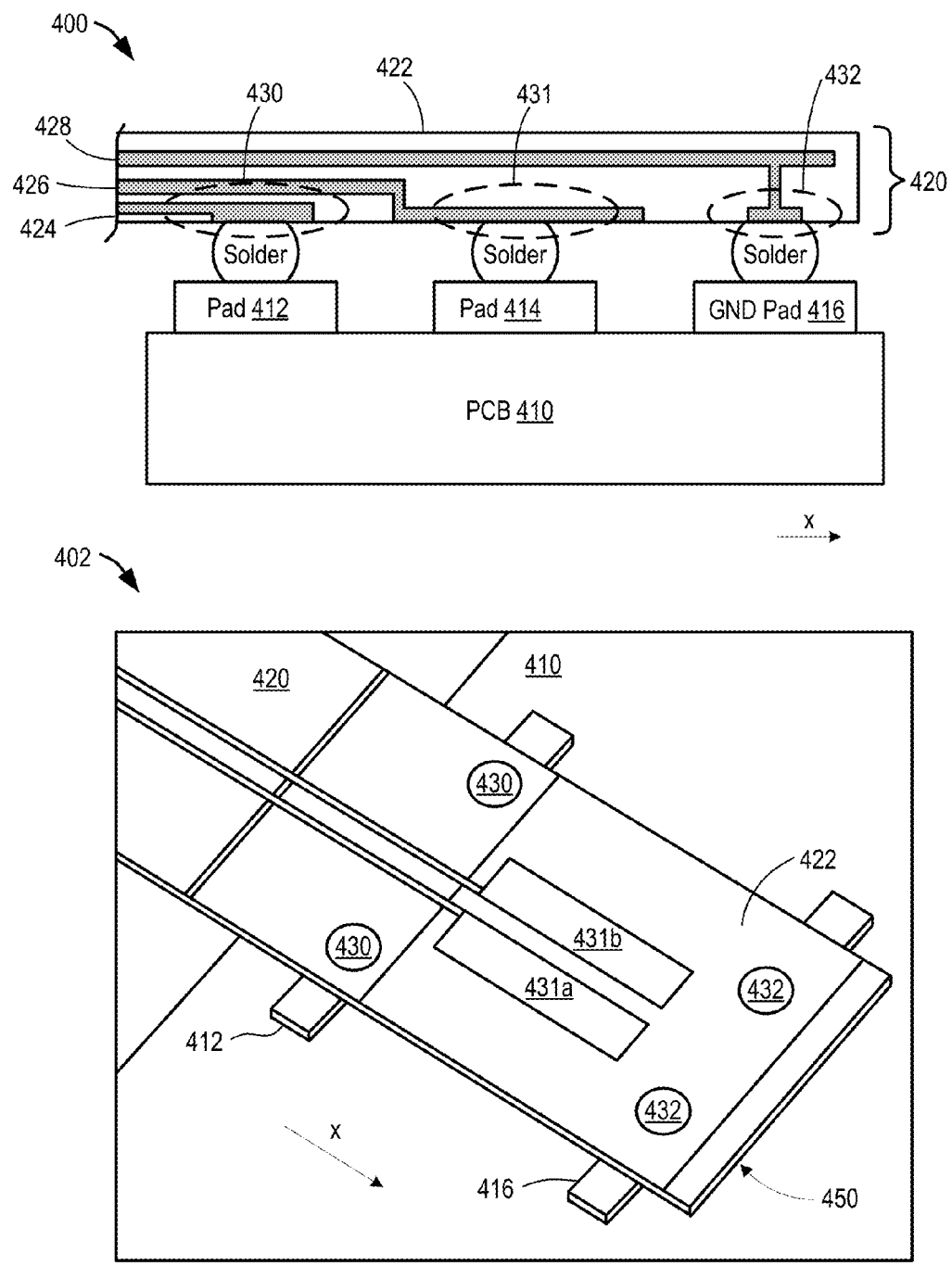
FIG. 4 shows a cross-sectional view and a perspective view of a system to couple a flexible circuit to a reference potential according to an embodiment.

FIG. 4 shows a cross-sectional view of a system 400 to provide signal shielding with a flexible circuit according to another embodiment. System 400 may include features of one of systems 300, 350 and/or may be fabricated according to method 200, for example. In system 400, a flexible circuit device 420, coupled to a PCB 410, includes a flexible substrate 422 having disposed therein interconnects 424, 426, 428 that variously extend each to include or couple to a respective one of contact points 430, 431, 432 at a same side of flexible substrate 422. Contact points 430, 431, 432 may enable coupling of interconnects 424, 426, 428 each to respective interface hardware in or on a rigid substrate of PCB 410. For example, interconnects 424, 426, 428 may be soldered to respective pads 412, 414, 416 of PCB 410. Interconnect 426 may be coupled to exchange a signal with PCB 410 via pad 414—e.g., where interconnect 428 is coupled to exchange via pad 416 a reference potential to facilitate shielding of interconnect 426. Although some embodiments are not limited in this regard, interconnect 424 may be coupled to exchange via pad 412 a ground signal, a data (or other) signal or, in some embodiments, a reference potential to facilitate further shielding of interconnect 426.

FIG. 4 further shows a perspective view 402 illustrating one implementation of system 400 according to an embodiment. As shown in view 402, flexible circuit device 420 may extend in a first direction (along the line x) to couple to PCB 410, where contact points 430, 431, 432 are located at successively farther distances along that direction from some reference, such as a distal end 450 of flexible circuit device 420. In the embodiment represented by view 402, two contact points 431a, 431b are disposed along a line of such direction between contacts 430, 431—e.g., where contact points 431a, 431b are to variously exchange respective signals (e.g., of a differential signal pair) between flexible circuit device 422 and PCB 410.

Figure 5A:
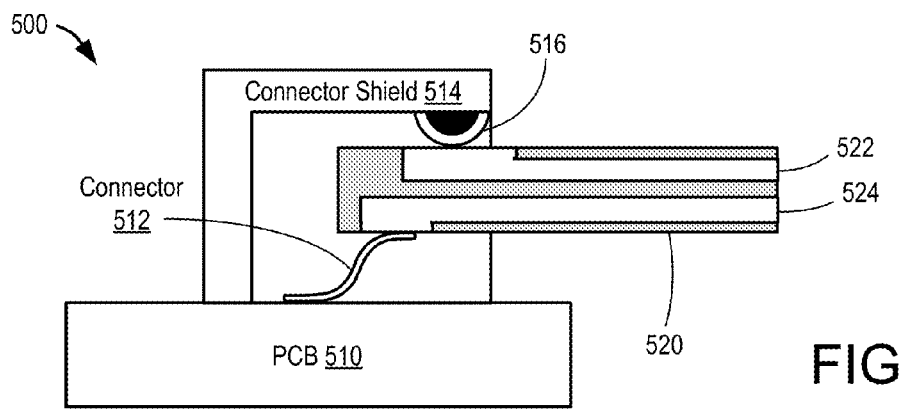
FIGS. 5A-5C are cross-sectional views each illustrating elements of a respective system to couple a flexible circuit to a reference potential according to a corresponding embodiment.

FIG. 5A shows a cross-sectional view of a system 500 to provide a reference potential with flexible circuitry according to another embodiment. Fabrication of some or all of system 500 may include one or more operations of method 200, for example. In system 500, a flexible circuit device 520, coupled to a PCB 510, includes interconnects 522, 524 disposed in a flexible substrate. A connector shield 514 of PCB 510 (the connector shield 514 coupled to a rigid substrate of PCB 510) may extend over a connector 512 of PCB 510—e.g., where connector shield 514 forms or couples to a contact structure 516 that is above connector 512. In one illustrative embodiment, connector shield 514 has a height in a range of 1.2-1.5 mm and a depth (to receive flexible circuit device 520) in a range of 2.2-4.2 mm. Alternatively or in addition, connector shield 514 may have a width to accommodate a plurality of coplanar interconnects—e.g. where connector shield 514 is between 16-20 mm wide to accommodate a row of thirty (30) signal lines arranged to have a 0.5 mm pitch. However, such dimensions may vary significantly across different embodiments, according to implementation-specific details.

Coupling of flexible circuit device 520 to PCB 510 may include inserting the end of flexible circuit device 520 between connector 512 and contact structure 516. The insertion of flexible circuit device 520 may enable coupling (on opposite sides of flexible circuit device 520) of connector 512 to interconnect 522 and of contact structure 516 to interconnect 524. Contact structure 516 may facilitate a conductive path from interconnect 522 via connector shield 514 to a ground plane or other structure (not shown) of PCB 510, where the structure is to exchange a reference potential with flexible circuit device 520. In providing for such a reference potential exchange, contact structure 516 may prevent or otherwise mitigate EMI that might otherwise be generated where interconnect 522 extends below connector shield 514. Contact structure 516 may thus provide for improved shielding to mitigate EMI in a signal exchanged between interconnect 524 and connector 512.

Figure 5B:
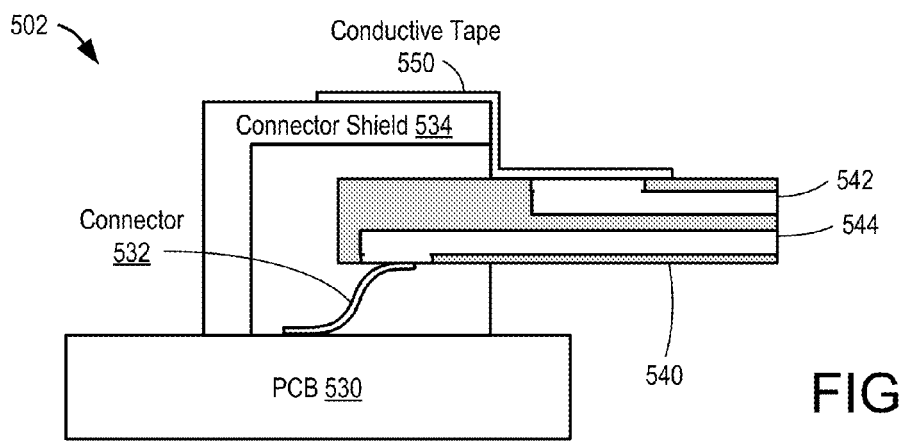

FIG. 5B shows a cross-sectional view of a system 502 to provide a reference potential according to another embodiment. System 502 may include one or more features of system 500, for example. In an embodiment, system 502 includes a flexible circuit device 520 and a PCB 530 coupled thereto, where flexible circuit device 520 includes interconnects 522, 524 disposed in a flexible substrate. Interconnects 522, 524 may variously extend each to include or couple to a respective one of contact points on opposite sides of flexible circuit device 540. A connector shield 534 of PCB 530 may extend over a connector 532 of PCB 530, where an end of flexible circuit device 540 is inserted between connector 532 and an upper portion of connector shield 534 for coupling of flexible circuit device 540 to PCB 530. Conductive tape 550—e.g., including a copper foil—may facilitate a conductive path from interconnect 542 via connector shield 534 to a structure (not shown) of PCB 530 that is to exchange a reference potential with flexible circuit device 540. Application of conductive tape 550 over connector shield 534 and a contact point for interconnect 542 may prevent or otherwise mitigate the generation of EMI at or below connector shield 534. Conductive tape 550 may thus provide for improved shielding to mitigate EMI in a signal exchanged between interconnect 544 and connector 532.

Figure 5C:
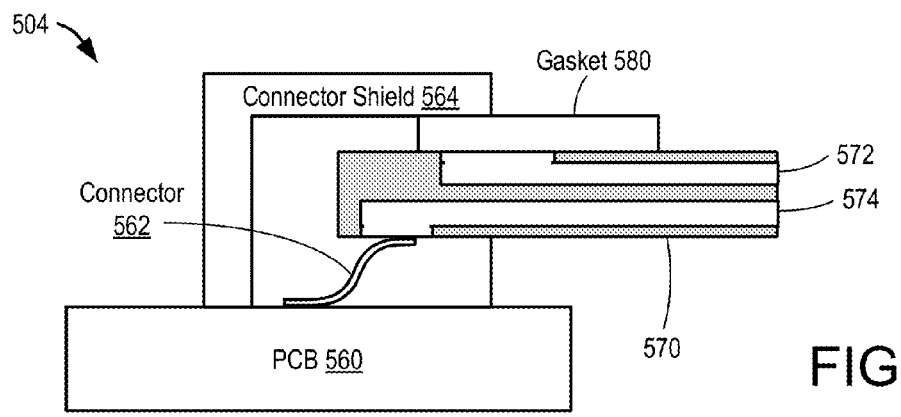

FIG. 5C shows a cross-sectional view of a system 504 to provide a reference potential according to another embodiment. System 504 may include features of one of systems 500, 502, for example. In an embodiment, system 504 includes a flexible circuit device 570 and a PCB 560, where flexible circuit device 570 includes interconnects 572, 574 disposed in a flexible substrate. Interconnects 572, 574 may variously extend each to include or couple to a respective one of contact points on opposite sides of flexible circuit device 570. A connector shield 564 of PCB 560 may extend over a connector 562 of PCB 560—e.g., where an end of flexible circuit device 570 is inserted between connector 562 and an upper portion of connector shield 564 for coupling of flexible circuit device 570 to PCB 560. A conductive gasket 580 may facilitate a conductive path from interconnect 572 via connector shield 564 to a structure (not shown) of PCB 560 that is to exchange a reference potential with flexible circuit device 570. Positioning of gasket 580 between connector shield 564 and a contact point for interconnect 572 may prevent or otherwise mitigate the generation of EMI at or below connector shield 564. Gasket 580 may thus provide for improved shielding for a signal exchanged between interconnect 574 and connector 562.

Figure 6:
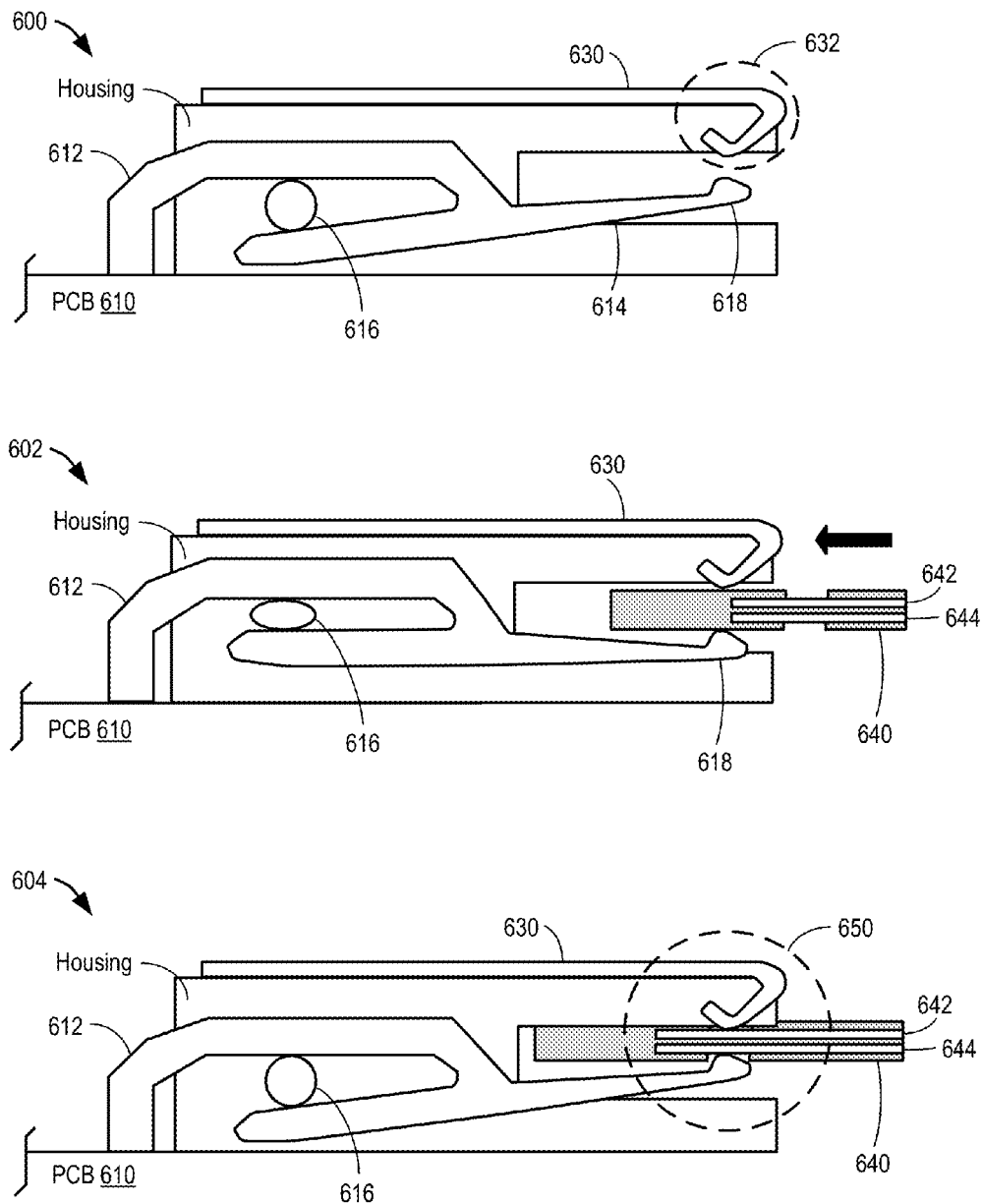
FIG. 6 shows cross-sectional views of operations to couple a flexible circuit to a reference potential according to a corresponding embodiment.

FIG. 6 shows in cross-sectional views various stages 600, 602, 604 of operations to couple a PCB 610 to a flexible circuit device 620 according to an embodiment. Such coupling may form one of systems 300, 350, 400, for example. In an embodiment, coupling of PCB 610 to flexible circuit device 620 includes operations of method 200.

Flexible circuit device 640 includes interconnects 642, 644 disposed in a flexible substrate. Interconnects 642, 644 may variously extend each to include or couple to a respective one of contact points on opposite sides of flexible circuit device 640. Connector hardware of PCB 610 may include a housing having disposed therein or thereon hardware to facilitate coupling to interconnect 644 at a corresponding side of flexible circuit device 640. Such hardware may include, for example, a connector base 612, an arm 614 and a contact 618 at a distal end of arm 614. Additional hardware of PCB 610 may facilitate coupling to interconnect 642 at an opposite side of flexible circuit device 640. By way of illustration and not limitation, a conductor 630 disposed in or on the housing may include or couple to a contact 632 that is above (and in an embodiment, opposite) contact 618.

As shown in stages 602, 604, coupling of flexible circuit device 640 to PCB 610 may include inserting an end of flexible circuit device 640 between contacts 618, 632. The insertion of flexible circuit device 640 may cause deflection of arm 614 (and compression of flexor 616) to accommodate further insertion of flexible circuit device 640. In some embodiments, one or each of contacts 618, 632 is brought into proximity with a respective recess on a corresponding side of flexible circuit device 640. Compression force at flexor 616 may press contacts 618, 632 in region 650 each against a corresponding contact point of flexible circuit device 640. Conductor 630 and contact 632 may facilitate a conductive path from interconnect 642 to a ground plane or other structure (not shown) of PCB 610 that is to exchange a reference potential with flexible circuit device 640. Conductor 630 and contact 632 may thus provide for improved shielding to mitigate EMI in a signal exchanged between interconnect 644 and PBC 610 via contact 618, arm 614 and connector base 612.

Figure 7:
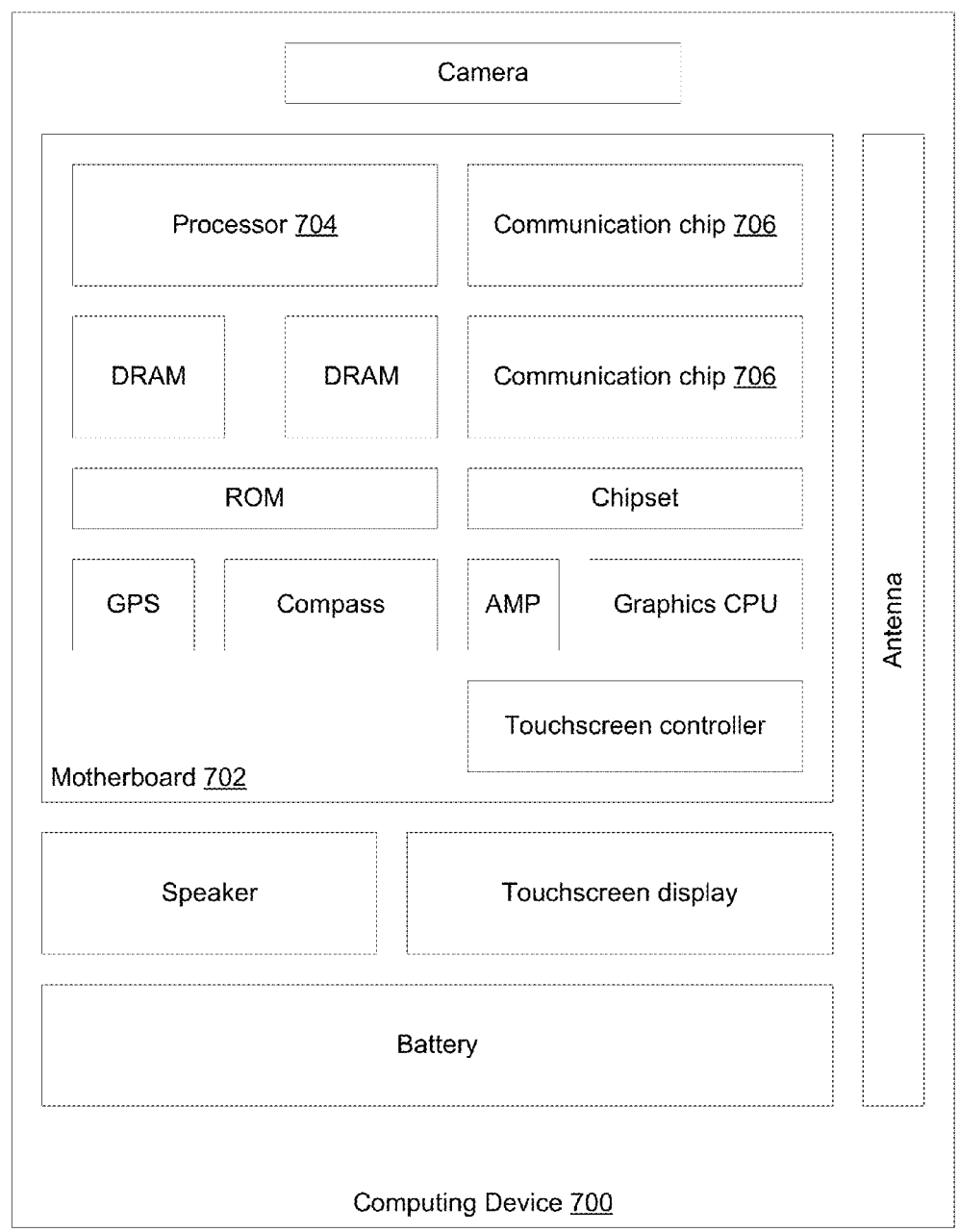
FIG. 7 illustrates a computing device in accordance with one embodiment.

FIG. 7 illustrates a computing device 700 in accordance with one embodiment. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The term "processor" may refer to any device or portion of a device that processes electronic data from registers and/or memory to transform that electronic data into other electronic data that may be stored in registers and/or memory. The communication chip 706 also includes an integrated circuit die packaged within the communication chip 706.

In various implementations, the computing device 700 may be a laptop, a netbook, a notebook, an Ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Embodiments may be variously provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
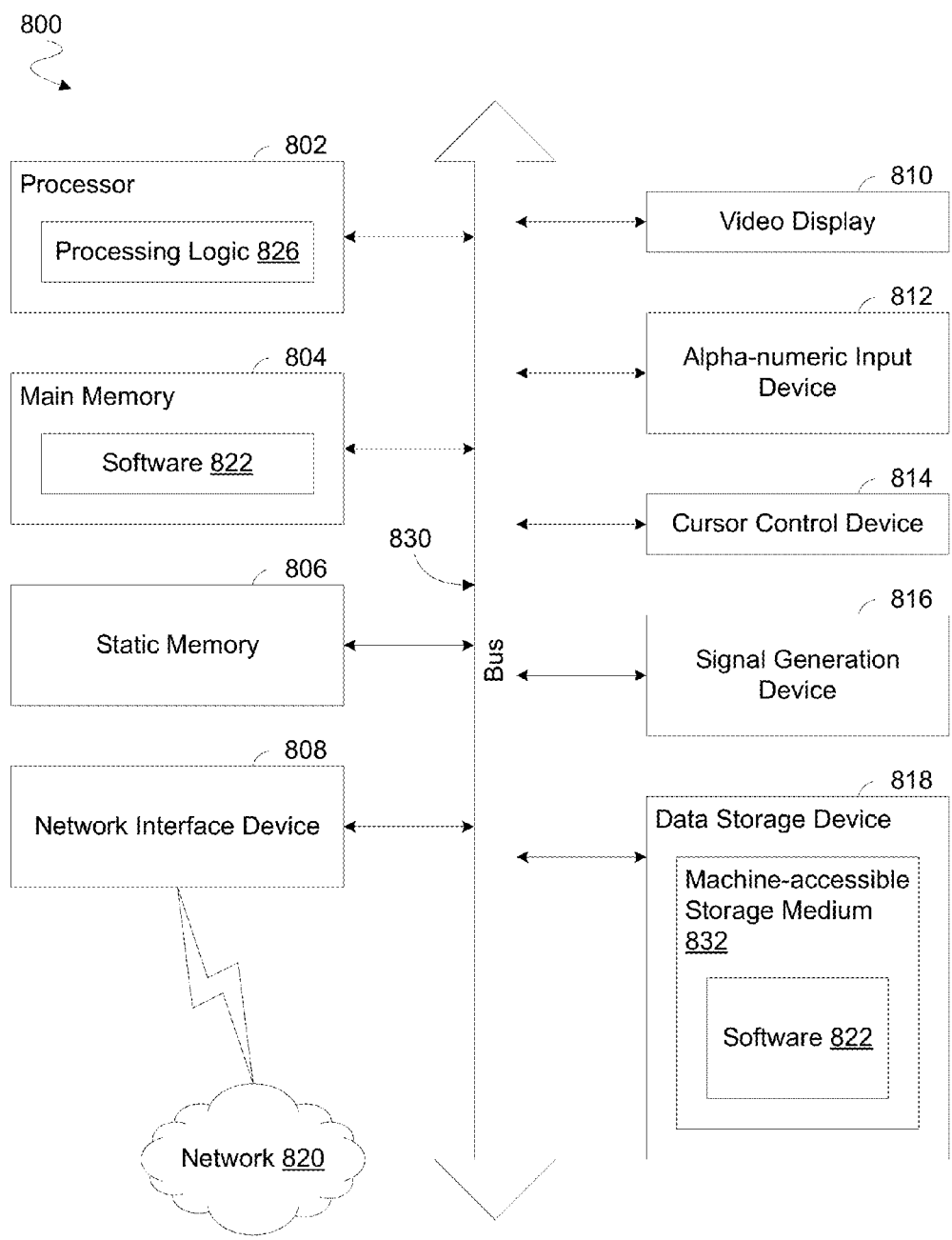
FIG. 8 illustrates a block diagram of an exemplary computer system, in accordance with an embodiment.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of an embodiment. The term "machine-readable storage medium" shall accordingly be taken to include, but not be limited to, solid-state memories, and optical and magnetic media.

Figure 9:
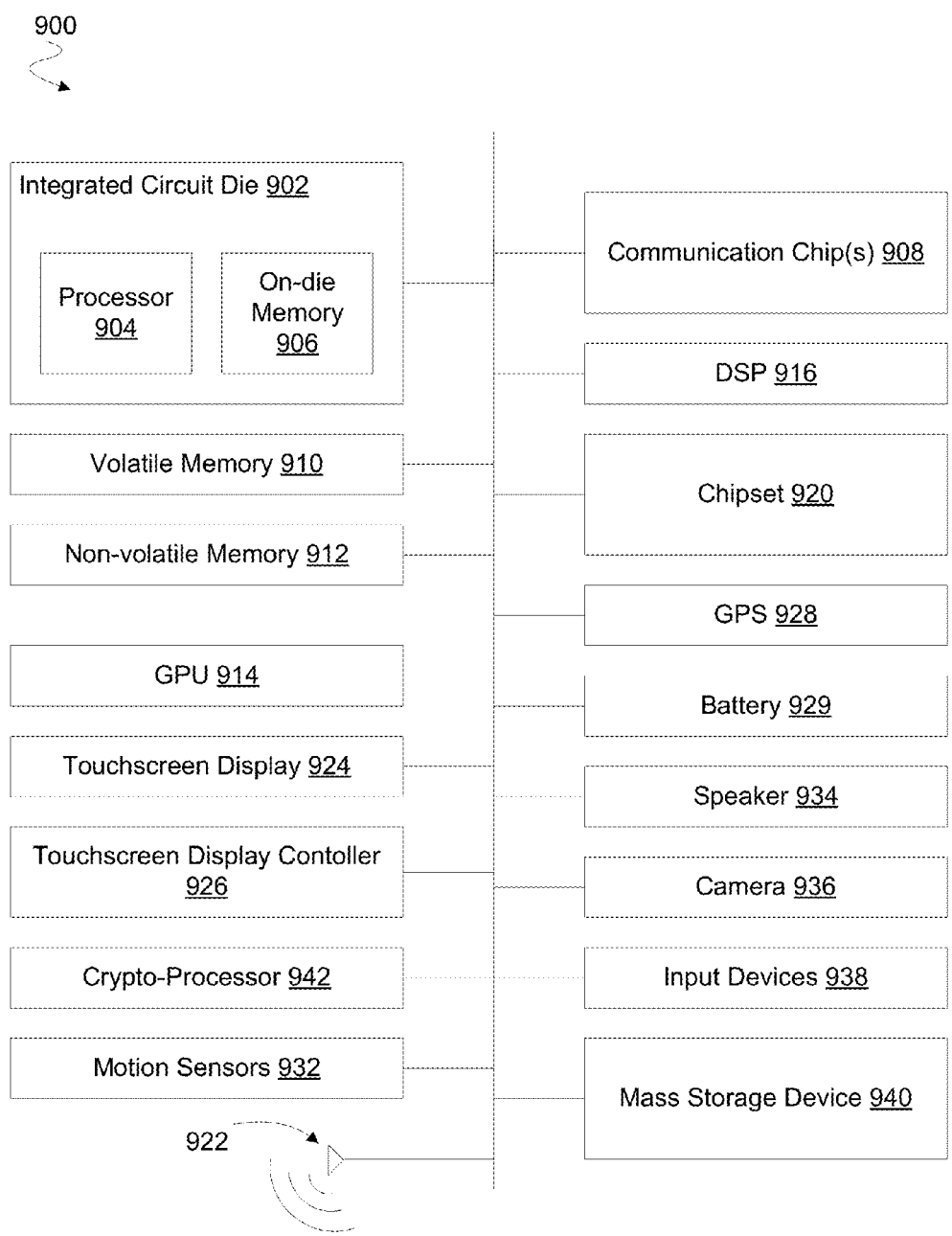
FIG. 9 is a computing device built in accordance with an embodiment.

FIG. 9 illustrates a computing device 900 in accordance with one embodiment. The computing device 900 may include a number of components. In one embodiment, these components are attached to one or more motherboards. In an alternate embodiment, these components are fabricated onto a single system-on-a-chip (SoC) die rather than a motherboard. The components in the computing device 900 include, but are not limited to, an integrated circuit die 902 and at least one communication chip 908. In some implementations the communication chip 908 is fabricated as part of the integrated circuit die 902. The integrated circuit die 902 may include a CPU 904 as well as on-die memory 906, often used as cache memory, that can be provided by technologies such as embedded DRAM (eDRAM) or spin-transfer torque memory (STTM or STTM-RAM).

Computing device 900 may include other components that may or may not be physically and electrically coupled to the motherboard or fabricated within an SoC die. These other components include, but are not limited to, volatile memory 910 (e.g., DRAM), non-volatile memory 912 (e.g., ROM or flash memory), a graphics processing unit 914 (GPU), a digital signal processor 916, a crypto processor 942 (a specialized processor that executes cryptographic algorithms within hardware), a chipset 920, an antenna 922, a display or a touchscreen display 924, a touchscreen controller 926, a battery 929 or other power source, a power amplifier (not shown), a global positioning system (GPS) device 928, a compass 930, a motion coprocessor or sensors 932 (that may include an accelerometer, a gyroscope, and a compass), a speaker 934, a camera 936, user input devices 938 (such as a keyboard, mouse, stylus, and touchpad), and a mass storage device 940 (such as hard disk drive, compact disk (CD), digital versatile disk (DVD), and so forth).

The communications chip 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 908. For instance, a first communication chip 908 may be dedicated to shorter range wireless communications such as Wi-Fi and Bluetooth and a second communication chip 908 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. In various embodiments, the computing device 900 may be a laptop computer, a netbook computer, a notebook computer, an Ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

In an implementation, a flexible circuit device comprises a flexible substrate having disposed therein a first interconnect and a second interconnect, and a hardware interface configured to couple the flexible substrate to a printed circuit board. The hardware interface includes a first contact coupled to the first interconnect, wherein, while the flexible circuit device is coupled to the printed circuit board, the first contact to exchange a signal between the first interconnect and a third interconnect of the printed circuit board, and a second contact coupled to the second interconnect, wherein, while the flexible circuit device is coupled to the printed circuit board, the second contact to exchange a reference potential between the second interconnect and a fourth interconnect of the printed circuit board, wherein, while the flexible circuit device is coupled to the printed circuit board, a maximum height of the second interconnect from a side of the printed circuit board at the hardware interface is greater than a maximum height of the first interconnect from the side of the printed circuit board at the hardware interface.

In an embodiment, the first contact and the second contact are both disposed at a first side of the flexible substrate. In another embodiment, the first contact is disposed at a first side of the flexible substrate and the second contact is disposed at a second side of the flexible substrate, the second side opposite the first side. In another embodiment, a width of the second interconnect is greater than a width of the first interconnect. In another embodiment, the second interconnect extends across a plurality of signal lines of the flexible circuit device, wherein the plurality of signal lines includes the first interconnect. In another embodiment, while the flexible circuit device is coupled to the printed circuit board, an end of the flexible circuit device is positioned over the side of the printed circuit board, wherein a distance of the first interconnect from the end of the flexible circuit device is different than a distance of the second interconnect from the end of the flexible circuit device.

In another implementation, system comprises a flexible circuit device including flexible substrate having disposed therein a first interconnect and a second interconnect, and a printed circuit board coupled to the flexible circuit device, the printed circuit board comprising a rigid substrate having disposed therein a third interconnect coupled to the first interconnect, and a fourth interconnect coupled to the second interconnect. The first interconnect and the third interconnect are configured to exchange a signal with each other via a hardware interface, wherein the second interconnect and the further interconnect are configured to exchange a reference potential with each other via the hardware interface, and wherein a maximum height of the second interconnect from a side of the printed circuit board at the hardware interface is greater than a maximum height of the first interconnect from the side of the printed circuit board at the hardware interface.

In another embodiment, the flexible circuit device and the printed circuit board are soldered to each other at the hardware interface. In another embodiment, the printed circuit board further comprises a connector shield extending over the hardware interface, wherein the second interconnect and the fourth interconnect are coupled to one another via the connector shield. In another embodiment, the second interconnect and the connector shield are coupled to one another via conductive tape disposed across a portion of the connector shield and a contact of the flexible circuit board. In another embodiment, the second interconnect and the connector shield are coupled to one another via conductive gasket disposed between a portion of the connector shield and a contact of the flexible circuit board. In another embodiment, the first interconnect and the third interconnect are coupled to one another via a first contact of the hardware interface, the first contact at a first side of the flexible substrate, wherein the second interconnect and the fourth interconnect are coupled to one another via a second contact of the hardware interface, the second contact at the first side of the flexible substrate. In another embodiment, the first interconnect and the third interconnect are coupled to one another via a first contact of the hardware interface, the first contact at a first side of the flexible substrate, wherein the second interconnect and the fourth interconnect are coupled to one another via a second contact of the hardware interface, the second contact at the second side of the flexible substrate, the second side opposite the first side.

In another implementation, a device comprises a rigid substrate having disposed therein a first interconnect and a second interconnect, and a hardware interface configured to couple the device to a flexible circuit device. The hardware interface includes a first contact disposed at a side of the rigid substrate, the first contact coupled to the first interconnect, wherein, while the device is coupled to the flexible circuit device, the first contact further to exchange a signal between the first interconnect and a third interconnect of the flexible circuit, and a second contact disposed, the second contact coupled to the second interconnect, wherein, while the device is coupled to the flexible circuit device, the second contact further to exchange a reference potential between the second interconnect and a fourth interconnect of the flexible circuit, wherein, while the device is coupled to the flexible circuit device, a maximum height of the fourth interconnect from the side of the rigid substrate at the hardware interface is greater than a maximum height of the third interconnect from the side of the rigid substrate at the hardware interface. In an embodiment, the first contact and the second contact are both disposed at the side of the rigid substrate. In another embodiment, the device further comprises a connector shield extending over the hardware interface, wherein, while the device is coupled to the flexible circuit device, the second interconnect and the fourth interconnect are coupled to one another via the connector shield.

In another implementation, a method comprises coupling a flexible circuit device to a rigid substrate, the flexible circuit device including a flexible substrate having disposed therein a first interconnect and a second interconnect, wherein a hardware interface of the flexible circuit device includes a first contact and a second contact, the first contact disposed at a side of the flexible substrate. The coupling the flexible circuit device to the rigid substrate includes coupling the first interconnect via the first contact to a third interconnect extending in the rigid substrate, and coupling the second interconnect via the second contact to a fourth interconnect extending in the rigid substrate, wherein, while the rigid substrate is coupled to the flexible circuit device, a maximum height of the second interconnect from the side of the rigid substrate at the hardware interface is greater than a maximum height of the first interconnect from the side of the rigid substrate at the hardware interface. The method further comprises exchanging a signal via the first contact between the first interconnect and the third interconnect, and exchanging a reference potential via the second contact between the second interconnect and the fourth interconnect.

In another embodiment, coupling the first interconnect via the first contact to the third interconnect and coupling the second interconnect via the second contact to the fourth interconnect includes soldering at the first contact or at the second contact. In another embodiment, the printed circuit board comprises a connector shield extending over the side of the flexible substrate, wherein coupling the second interconnect via the second contact to the fourth interconnect includes coupling the second contact to the fourth interconnect via the connector shield. In another embodiment, coupling the second contact to the fourth interconnect via the connector shield includes disposing conductive tape across a portion of the connector shield and the second contact. In another embodiment, coupling the second contact to the fourth interconnect via the connector shield includes disposing a conductive gasket between a portion of the connector shield and the second contact.

Techniques and architectures for providing connection with a flexible circuit device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A flexible circuit device comprising:
    a flexible substrate having disposed therein a first interconnect and a second interconnect, wherein a first side of the flexible substrate is opposite a second side of the flexible substrate; and
    a hardware interface configured to couple the flexible substrate to a printed circuit board, the hardware interface including a first contact coupled to the first interconnect and a second contact coupled to the second interconnect, wherein the first contact and the second contact are each at a respective one of the first side and the second side, wherein the first interconnect includes or couples to a first via structure within the flexible substrate, wherein the second interconnect includes or couples to a second via structure within the flexible substrate, wherein the first via structure and the second via structure each which extend perpendicular to the first side, wherein, while the flexible circuit device is coupled to the printed circuit board:
- the first contact to exchange a signal between the first interconnect and a third interconnect of the printed circuit board; and
- the second contact to exchange a reference potential between the second interconnect and a fourth interconnect of the printed circuit board;

wherein, while the flexible circuit device is coupled to the printed circuit board, a maximum height of the second interconnect from a side of the printed circuit board at the hardware interface is greater than a maximum height of the first interconnect from the side of the printed circuit board at the hardware interface, wherein the first contact is disposed at the first side of the flexible substrate and the second contact is disposed at the second side of the flexible substrate.

2. The flexible circuit device of claim 1, wherein the first contact and the second contact are both disposed at the first side of the flexible substrate.

3. The flexible circuit device of claim 1, wherein a width of the second interconnect is greater than a width of the first interconnect.

4. The flexible circuit device of claim 3, wherein the second interconnect extends across a plurality of signal lines of the flexible circuit device, wherein the plurality of signal lines includes the first interconnect.

5. The flexible circuit device of claim 1, wherein, while the flexible circuit device is coupled to the printed circuit board, an end of the flexible circuit device is positioned over the side of the printed circuit board, wherein a distance of the first interconnect from the end of the flexible circuit device is different than a distance of the second interconnect from the end of the flexible circuit device.

* * * * *